United States Patent
Wang

(10) Patent No.: US 9,972,262 B2
(45) Date of Patent: May 15, 2018

(54) SHIFT REGISTER AND ITS DRIVING METHOD, GATE DRIVING CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Jiguo Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 212 days.

(21) Appl. No.: 15/147,239

(22) Filed: May 5, 2016

(65) Prior Publication Data

US 2017/0092212 A1 Mar. 30, 2017

(30) Foreign Application Priority Data

Sep. 25, 2015 (CN) .......................... 2015 1 0624977

(51) Int. Cl.
| | |
|---|---|
| G11C 19/00 | (2006.01) |
| G09G 3/36 | (2006.01) |
| G11C 19/28 | (2006.01) |
| G09G 3/20 | (2006.01) |

(52) U.S. Cl.
CPC ............. *G09G 3/3648* (2013.01); *G09G 3/20* (2013.01); *G11C 19/28* (2013.01); *G09G 3/3677* (2013.01); *G09G 2300/0408* (2013.01); *G09G 2310/0267* (2013.01); *G09G 2310/0286* (2013.01); *G09G 2320/0214* (2013.01)

(58) Field of Classification Search
None
See application file for complete search history.

(56) References Cited

U.S. PATENT DOCUMENTS

| | | | | |
|---|---|---|---|---|
| 2016/0293092 A1* | 10/2016 | Li | ............................ | G09G 3/20 |
| 2017/0061913 A1* | 3/2017 | Wang | ......................... | G09G 3/36 |
| 2017/0193887 A1* | 7/2017 | Wang | .................... | G09G 3/2092 |
| 2017/0200418 A1* | 7/2017 | Zhang | ................... | G09G 3/3266 |

* cited by examiner

*Primary Examiner* — Tuan T Lam
(74) *Attorney, Agent, or Firm* — Ladas & Parry LLP

(57) ABSTRACT

A shift register and its driving method, a gate driving circuit and a display device, wherein the shift register comprises an input module (1), a reset module (2), a first control module (3), a second control module (4), a first output module (5) and a second output module (6), through which, the shift register makes the potential at the third node (C) for controlling the first output module (5) in a stable status via the first control module (3), and makes the potential at the fourth node (D) for controlling the second output module (6) in a stable status via the second control module (4), thereby achieving stability of the scanning signal outputted by the driving signal output terminal (Output) of the shift register, further reducing noise of the scanning signal outputted by the driving signal output terminal (Output), and improving stability of an output of the shift register.

20 Claims, 11 Drawing Sheets

SHIFT REGISTER AND ITS DRIVING METHOD, GATE DRIVING CIRCUIT AND DISPLAY DEVICE

TECHNICAL FIELD

The present disclosure relates to a shift register and its driving method, a gate driving circuit and a display device.

BACKGROUND

With the rapid development of display technique, displays show a development trend of high integration and low cost. The Gate Driver on Array (GOA) technique integrates gate switching circuits of a Thin Film Transistor (TFT) on an array substrate of a display panel to form a scan driving to the display panel, so as to leave out wiring space of a bonding area and a fan-out area of a gate Integrated Circuit (IC), which can not only reduce product cost in two aspects of material cost and manufacturing process, but also achieve symmetry on both sides of the display panel and a beautiful design of a narrow border. Also, such integration technique can eliminate the need of bonding process in a gate scanning line direction, and thus improve productivity and yield.

A GOA circuit usually is composed of a plurality of cascaded shift registers, wherein a driving signal output terminal of the shift register in each stage corresponds to one gate line, respectively, so that respective gate lines are set along a scanning direction. However, among the shift registers employed in most GOA circuits, a node of a switching transistor for controlling an output under control of a clock signal will always be in a floating status. A potential at this node will be affected by leakage of ambient switching transistors, causing that a gate potential of the switching transistor for outputting is unstable, and that a scanning signal outputted by a driving signal output terminal has relatively large noise, thereby affecting a stable output of the shift register.

SUMMARY

Embodiments of the present disclosure provide a shift register and its driving method, a gate driving circuit and a display device, for reducing noise of a scanning signal outputted by a driving signal output terminal, thereby improving stability of an output of the shift register.

Accordingly, an embodiment of the present disclosure provides a shift register, comprising an input module, a reset module, a first control module, a second control module, a first output module and a second output module.

A first terminal of the input module is connected to an input signal terminal, a second terminal thereof is connected to a first reference signal terminal, a third terminal thereof is connected to a first clock signal terminal, a fourth terminal thereof is connected to a first node and a fifth terminal thereof is connected to a second node. The input module is configured to supply a signal from the first reference signal terminal to the first node under control of the input signal terminal, and supply a signal from the first clock signal terminal to the second node under control of the first reference signal terminal.

A first terminal of the reset module is connected to a reset signal terminal, a second terminal thereof is connected to a second reference signal terminal, a third terminal thereof is connected to a second clock signal terminal, a fourth terminal thereof is connected to the first node and a fifth terminal thereof is connected to the second node. The reset module is configured to supply a signal from the second reference signal terminal to the first node under control of the reset signal terminal, and supply a signal from the second clock signal terminal to the second node under control of the second reference signal terminal.

A first terminal of the first control module is connected to a first DC signal terminal, a second terminal thereof is connected to a second DC signal terminal, a third terminal thereof is connected to the first node, a fourth terminal thereof is connected to a third node and a fifth terminal thereof is connected to a fourth node. The first control module is configured to supply a signal from the first DC signal terminal to the third node under control of the first node, supply a signal from the second DC signal terminal to the third node under control of the fourth node, and maintain a potential at the first node in a stable status when the first node is in a floating status.

A first terminal of the second control module is connected to the first DC signal terminal, a second terminal thereof is connected to the second DC signal terminal, a third terminal thereof is connected to the first node, a fourth terminal connected to the second node and a fifth terminal thereof is connected to the fourth node. The second control module is configured to supply a signal from the first DC signal terminal to the fourth node under control of the second node, supply a signal from the second DC signal terminal to the fourth node under control of the first node, and maintain a potential at the fourth node in a stable status when the fourth node is in a floating status.

A first terminal of the first output module is connected to a third clock signal terminal, a second terminal thereof is connected to the third node and a third terminal thereof is connected to a driving signal output terminal of the shift register. The first output module is configured to supply a signal from the third clock signal terminal to the driving signal output terminal under control of the third node.

A first terminal of the second output module is connected to the second DC signal terminal, a second terminal thereof is connected to the fourth node and a third terminal thereof is connected to the driving signal output terminal. The second output module is configured to supply a signal from the second DC signal terminal to the driving signal output terminal under control of the fourth node.

In an embodiment, the shift register described above further comprises a noise reduction module, wherein a first terminal of the noise reduction module is connected to the second DC signal terminal, a second terminal thereof is connected to the driving signal output terminal and a third terminal thereof is connected to the fourth node. The noise reduction module is configured to supply a signal from the second DC signal terminal to the fourth node under control of the driving signal output terminal.

In an embodiment, the input module includes a first switching transistor and a second switching transistor, wherein a gate of the first switching transistor is connected to the input signal terminal, a source thereof is connected to the first reference signal terminal and a drain thereof is connected to the first node; and a gate of the second switching transistor is connected to the first reference signal terminal, a source thereof is connected to the first clock signal terminal and a drain thereof is connected to the second node.

In an embodiment, the reset module includes a third switching transistor and a fourth switching transistor, wherein a gate of the third switching transistor is connected to the reset signal terminal, a source thereof is connected to the first node and a drain thereof is connected to the second reference signal terminal; and a gate of the fourth switching transistor is connected to the second reference signal terminal, a source thereof is connected to the second node and a drain thereof is connected to the second clock signal terminal.

In an embodiment, the first control module includes a fifth switching transistor, a sixth switching transistor and a first capacitor, wherein a gate of the fifth switching transistor is connected to the first node, a source thereof is connected to the first DC signal terminal and a drain thereof is connected to the third node; a gate of the sixth switching transistor is connected to the fourth node, a source thereof is connected to the third node and a drain thereof is connected to the second DC signal terminal; one terminal of the first capacitor is connected to the first node and the other terminal thereof is connected to the second DC signal terminal.

In an embodiment, the first control module further includes a seventh switching transistor connected between the source of the fifth switching transistor and the first DC signal terminal, wherein a gate and a source of the seventh switching transistor are both connected to the first DC signal terminal, and a drain thereof is connected to the source of the fifth switching transistor.

In an embodiment, the second control module includes an eighth switching transistor, a ninth switching transistor and a second capacitor, wherein a gate of the eighth switching transistor is connected to the second node, a source thereof is connected to the first DC signal terminal and a drain thereof is connected to the fourth node; a gate of the ninth switching transistor is connected to the first node, a source thereof is connected to the fourth node and a drain thereof is connected to the second DC signal terminal; one terminal of the second capacitor is connected to the fourth node and the other terminal thereof is connected to the second DC signal terminal.

In an embodiment, the first output module includes a tenth switching transistor, wherein a gate of the tenth switching transistor is connected to the third node, a source thereof is connected to the third clock signal terminal and a drain thereof is connected to the driving signal output terminal.

In an embodiment, the first output module further includes an eleventh switching transistor connected between the gate of the tenth switching transistor and the third node, wherein a gate of the eleventh switching transistor is connected to the first DC signal terminal, a source thereof is connected to the gate of the tenth switching transistor and a drain thereof is connected to the third node.

In an embodiment, the second output module includes a twelfth switching transistor, wherein a gate of the twelfth switching transistor is connected to the fourth node, a source thereof is connected to the driving signal output terminal and a drain thereof is connected to the second DC signal terminal.

In an embodiment, the noise reduction module includes a thirteenth switching transistor, wherein a gate of the thirteenth switching transistor is connected to the driving signal output terminal, a source thereof is connected to the fourth node and a drain thereof is connected to the second DC signal terminal.

Further, in the shift register provided by the embodiment of the present disclosure, in a case where a valid pulse signal of a signal from the input signal terminal is a high potential, all the switching transistors are N-type switching transistors; in a case where a valid pulse signal of a signal from the input signal terminal is a low potential, all the switching transistors are P-type switching transistors.

In addition, an embodiment of the present disclosure further provides a driving method for any of the shift register described above, the driving method comprising an input stage, an output stage, a reset stage and a reset maintenance stage.

In the input stage, the input module supplies a signal from a first reference signal terminal to a first node under control of an input signal terminal and supplies a signal from a first clock signal terminal to a second node under control of the first reference signal terminal, the first control module supplies a signal from a first DC signal terminal to a third node under control of the first node, the second control module supplies a signal from a second DC signal terminal to a fourth node under control of the first node, and a first output signal terminal supplies a signal from a third clock signal terminal to a driving signal output terminal under control of the third node.

In the output stage, the input module supplies a signal from the first clock signal terminal to the second node under control of the first reference signal terminal, the first control module maintains a potential at the first node in a stable status, the second control module supplies a signal from the second DC signal terminal to the fourth node under control of the first node, and the first output module supplies a signal from the third clock signal terminal to the driving signal output terminal under control of the third node.

In the reset stage, the input module supplies a signal from the first clock signal terminal to the second node under control of the first reference signal terminal, the reset module supplies a signal from the second reference signal terminal to the first node under control of a reset signal terminal, the first control module supplies a signal from the second DC signal terminal to the third node under control of the fourth node, the second control module supplies a signal from the first DC signal terminal to the fourth node under control of the second node, and the second output module supplies a signal from the second DC signal terminal to the driving signal output terminal under control of the fourth node.

In the reset maintenance stage, the input module supplies a signal from the first clock signal terminal to the second node under control of the first reference signal terminal, the first control module supplies a signal from the second DC signal terminal to the third node under control of the fourth node, the second control module maintains a potential at the fourth node in a stable status, and the second output module supplies a signal from the second DC signal terminal to the driving signal output terminal under control of the fourth node.

In an embodiment, the driving method described above further comprises: in the output stage, the noise reduction module supplies a signal from the second DC signal terminal to the fourth node under control of the driving signal output terminal.

In addition, an embodiment of the present disclosure further provides a gate driving circuit, comprising a plurality of cascaded shift registers provided above by the embodiment of the present disclosure, wherein an input signal terminal of a first-stage shift register is connected to a frame trigger signal terminal; an input signal terminal of a shift register in each of the remaining stages except the first-stage shift register is connected respectively to a driving signal output terminal of a previous-stage shift register; and a reset signal terminal of a shift register in each of the remaining stages except a last-stage shift register is connected respectively to a driving signal output terminal of a next-stage shift register.

In addition, an embodiment of the present disclosure further provides a display device comprising any gate driving circuit provided above by the embodiment of the present disclosure.

The shift register provided by the embodiment of the present disclosure comprises the input module, the reset module, the first control module, the second control module, the first output module and the second output module, wherein the input module controls the potential at the first node and the potential at the second node via the input signal terminal, the first reference signal terminal and the first clock signal terminal, the reset module controls the potential at the first node and the potential at the second node via the reset signal terminal, the second reference signal terminal and the second clock signal terminal, the first control module controls the potential at the first node and the potential at the third node via the first DC signal terminal, the second DC signal terminal, the first node and the fourth node, the second control module controls the potential at the fourth node via the first DC signal terminal, the second DC signal terminal, the first node and the second node, the first output module controls the potential at the driving signal output terminal via the third clock signal terminal and the third node, the second output module controls the potential at the driving signal output terminal via the second DC signal terminal and the fourth node. In the shift register provided by the embodiment of the present disclosure, the potential at the third node for controlling the first output module is made in a stable status via the first control module, and the potential at the fourth node for controlling the second output module is made in a stable status via the second control module, thereby achieving stability of the scanning signal outputted by the driving signal output terminal of the shift register, and further reducing noise of the scanning signal outputted by the driving signal output terminal, and improving stability of an output of the shift register.

BRIEF DESCRIPTION OF THE DRAWINGS

FIG. 2a is a schematic diagram of a structure of the shift register shown in FIG. 1a;

FIG. 2b is a schematic diagram of another structure of the shift register shown in FIG. 1a;

FIG. 4a is a circuit timing diagram of the shift register shown in FIG. 2a;

FIG. 4c is a circuit timing diagram of the shift register shown in FIG. 3a;

DETAILED DESCRIPTION OF THE EMBODIMENTS

Hereinafter, the shift register and its driving method, the gate driving circuit, and the display device provided by the embodiments of the present disclosure will be described in detail with reference to the accompanying drawings.

Figure 1A:
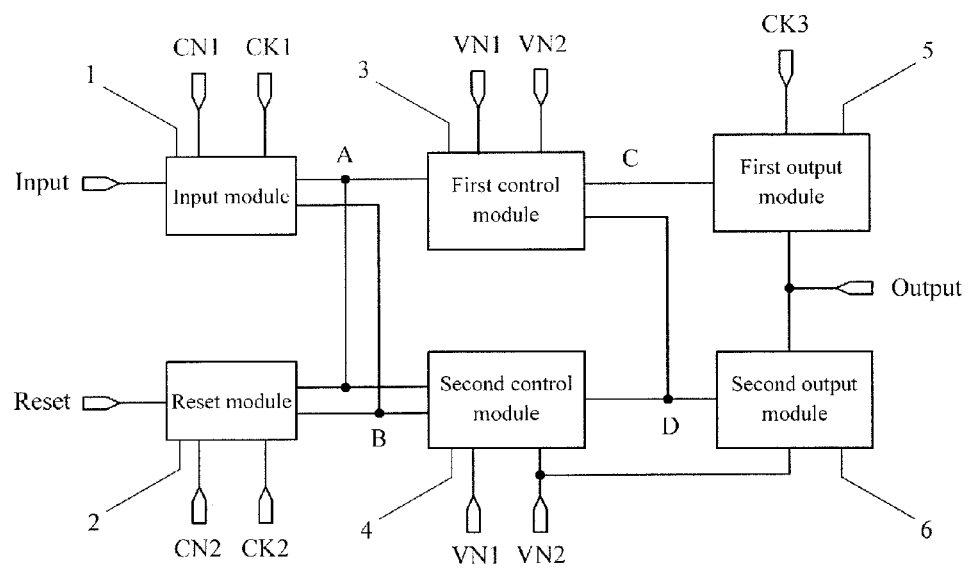
FIG. 1a is a schematic diagram of structure of a shift register provided by an embodiment of the present disclosure.

As shown in FIG. 1a, a shift register provided by an embodiment of the present disclosure comprises an input module 1, a reset module 2, a first control module 3, a second control module 4, a first output module 5 and a second output module 6.

A first terminal of the input module 1 is connected to an input signal terminal Input, a second terminal thereof is connected to a first reference signal terminal CN1, a third terminal thereof is connected to a first clock signal terminal CK1, a fourth terminal thereof is connected to a first node A and a fifth terminal thereof is connected to a second node B. The input module 1 is configured to supply a signal from the first reference signal terminal CN1 to the first node A under control of the input signal terminal Input, and supply a signal from the first clock signal terminal CK1 to the second node B under control of the first reference signal terminal CN1.

A first terminal of the reset module 2 is connected to a reset signal terminal Reset, a second terminal thereof is connected to a second reference signal terminal CN2, a third terminal thereof is connected to a second clock signal terminal CK2, a fourth terminal thereof is connected to the first node A and a fifth terminal thereof is connected to the second node B. The reset module 2 is configured to supply a signal from the second reference signal terminal CN2 to the first node A under control of the reset signal terminal Reset, and supply a signal from the second clock signal terminal CK2 to the second node B under control of the second reference signal terminal CN2.

A first terminal of the first control module 3 is connected to a first DC signal terminal VN1, a second terminal thereof is connected to a second DC signal terminal VN2, a third terminal thereof is connected to the first node A, a fourth terminal thereof is connected to a third node C and a fifth terminal thereof is connected to a fourth node D. The first control module 3 is configured to supply a signal from the first DC signal terminal VN1 to the third node C under control of the first node A, supply a signal from the second DC signal terminal VN2 to the third node C under control of the fourth node D, and maintain a potential at the first node A in a stable status when the first node A is in a floating status.

A first terminal of the second control module 4 is connected to the first DC signal terminal VN1, a second terminal thereof is connected to the second DC signal terminal VN2, a third terminal thereof is connected to the first node A, a fourth terminal connected to the second node B and a fifth terminal thereof is connected to the fourth node D. The second control module 4 is configured to supply a signal from the first DC signal terminal VN1 to the fourth node D under control of the second node B, supply a signal from the second DC signal terminal VN2 to the fourth node D under control of the first node A, and maintain a potential at the fourth node D in a stable status when the fourth node D is in a floating status.

A first terminal of the first output module 5 is connected to a third clock signal terminal CK3, a second terminal thereof is connected to the third node C and a third terminal thereof is connected to a driving signal output terminal Output of the shift register. The first output module 5 is configured to supply a signal from the third clock signal terminal CK3 to the driving signal output terminal Output under control of the third node C.

A first terminal of the second output module 6 is connected to the second DC signal terminal VN2, a second terminal thereof is connected to the fourth node D and a third terminal thereof is connected to the driving signal output terminal Output. The second output module is configured to supply a signal from the second DC signal terminal to the driving signal output terminal Output under control of the fourth node D.

The above shift register provided by the embodiment of the present disclosure comprises an input module, a reset module, a first control module, a second control module, a first output module and a second output module, wherein the input module controls the potential at the first node and the potential at the second node via the input signal terminal, the first reference signal terminal and the first clock signal terminal, the reset module controls the potential at the first node and the potential at the second node via the reset signal terminal, the second reference signal terminal and the second clock signal terminal, the first control module controls the potential at the first node and the potential at the third node via the first DC signal terminal, the second DC signal terminal, the first node and the fourth node, the second control module controls the potential at the fourth node via the first DC signal terminal, the second DC signal terminal, the first node and the second node, the first output module controls the potential at the driving signal output terminal via the third clock signal terminal and the third node, the second output module controls the potential at the driving signal output terminal via the second DC signal terminal and the fourth node. With mutual cooperation of the above six modules, the shift register makes the potential at the third node for controlling the first output module in a stable status via the first control module, and makes the potential at the fourth node for controlling the second output module in a stable status via the second control module, thereby achieving stability of the scanning signal outputted by the driving signal output terminal of the shift register, and further reducing noise of the scanning signal outputted by the driving signal output terminal, and improving stability of an output of the shift register.

It should be noted that, in the shift register provided above by the embodiment of the present disclosure, an input signal is received from the input signal terminal, a first clock signal is received from the first clock signal terminal, a second clock signal is received from the second clock signal terminal, a third clock signal is received from the third clock signal terminal, a first DC signal is received from the first DC signal terminal, a second DC signal is received from a second DC signal terminal, a first reference signal is received from a first reference signal terminal, a second reference signal is received from the second reference signal terminal, and a scanning signal is outputted from the driving signal output terminal. When a valid pulse signal of the input signal is a high potential, the first DC signal is a high potential, the second DC signal is a low potential; or when a valid pulse signal of the input signal is a low potential, the first DC signal is a low potential, the second DC signal is a high potential.

It should be noted that, in the shift register provided above by the embodiment of the present disclosure, the first clock signal, the second clock signal and the third clock signal have the same periodicity and the same duty cycle. When a valid pulse signal of an input signal is a high potential, a rising edge of the input signal and a rising edge of the second clock signal are aligned, a falling edge of the input signal, a falling edge of the second clock signal and a rising edge of the third clock signal are aligned, a rising edge of the first clock signal and a failing edge of the third clock signal are aligned; or, when a valid pulse signal of an input signal is a low potential, a falling edge of the input signal and a falling edge of the second clock signal are aligned, a rising edge of the input signal, a rising edge of the second clock signal and a falling edge of the third clock signal are aligned, a falling edge of the first clock signal and a rising edge of the third clock signal are aligned.

Figure 1B:
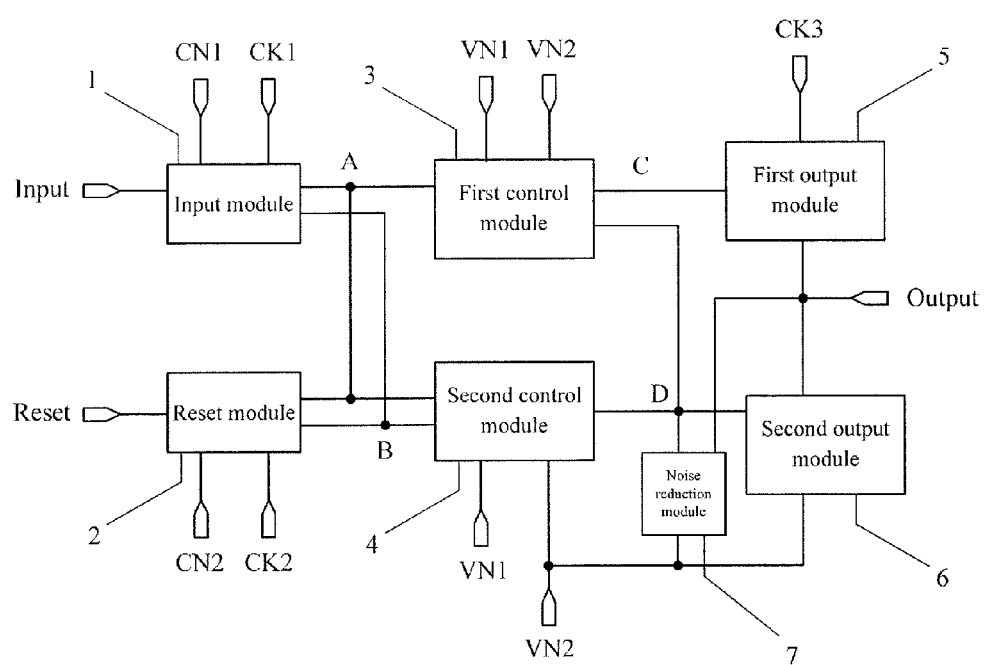
FIG. 1b is a schematic diagram of structure of a shift register provided by another embodiment of the present disclosure.

Further, in order to ensure that the potential at the fourth node for controlling the second output module is in a stable status, the shift register provided by the embodiment of the present disclosure may further comprise a noise reduction module 7, as shown in FIG. 1b.

A first terminal of the noise reduction module 7 is connected to the second DC signal terminal VN2, a second terminal thereof is connected to the driving signal output terminal Output and a third terminal thereof is connected to the fourth node D. The noise reduction module 7 is configured to supply a signal from the second DC signal terminal VN2 to the fourth node D under control of the driving signal output terminal Output.

Next, the present disclosure will be described in detail in combination with the embodiments. It should be noted that these embodiments are intended to better explain the present disclosure, rather than to limit the disclosure.

In the shift register provided by an embodiment of the present disclosure, as shown in FIGS. 2a to 3b, the input module 1 may include a first switching transistor M1 and a second switching transistor M2, wherein a gate of the first switching transistor M1 is connected to the input signal terminal Input, a source thereof is connected to the first reference signal terminal CN1 and a drain thereof is connected to the first node A; and a gate of the second switching transistor M2 is connected to the first reference signal terminal CN1, a source thereof is connected to the first clock signal terminal CK1 and a drain thereof is connected to the second node B.

Figure 2A:
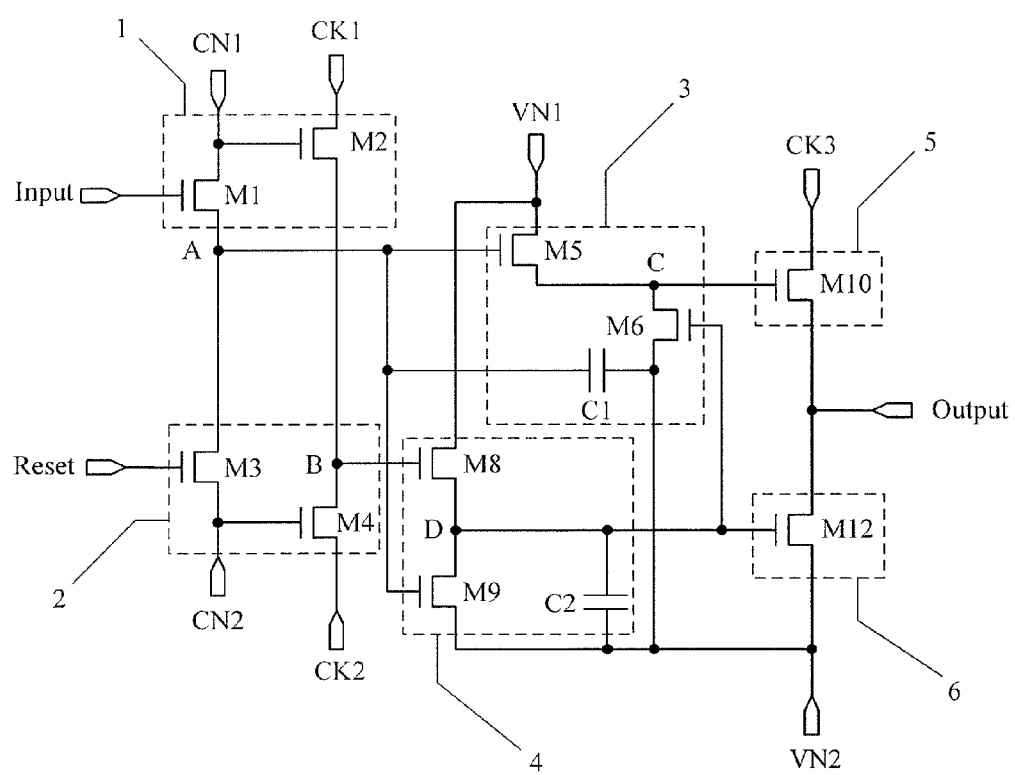
Figure 2B:
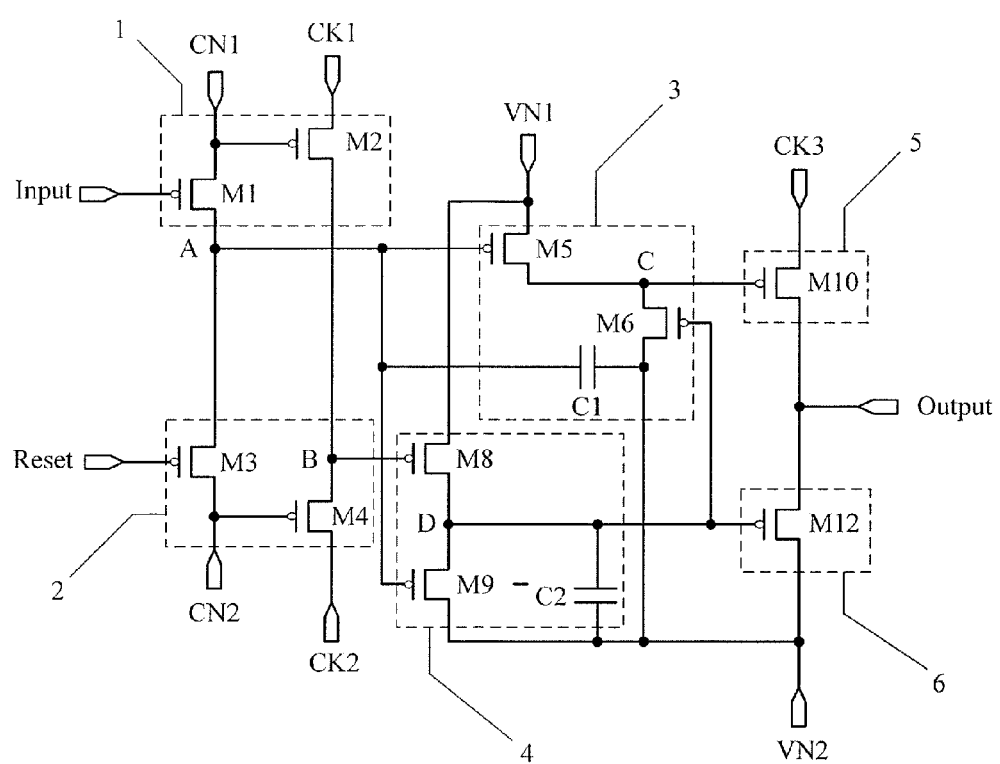
Figure 3A:
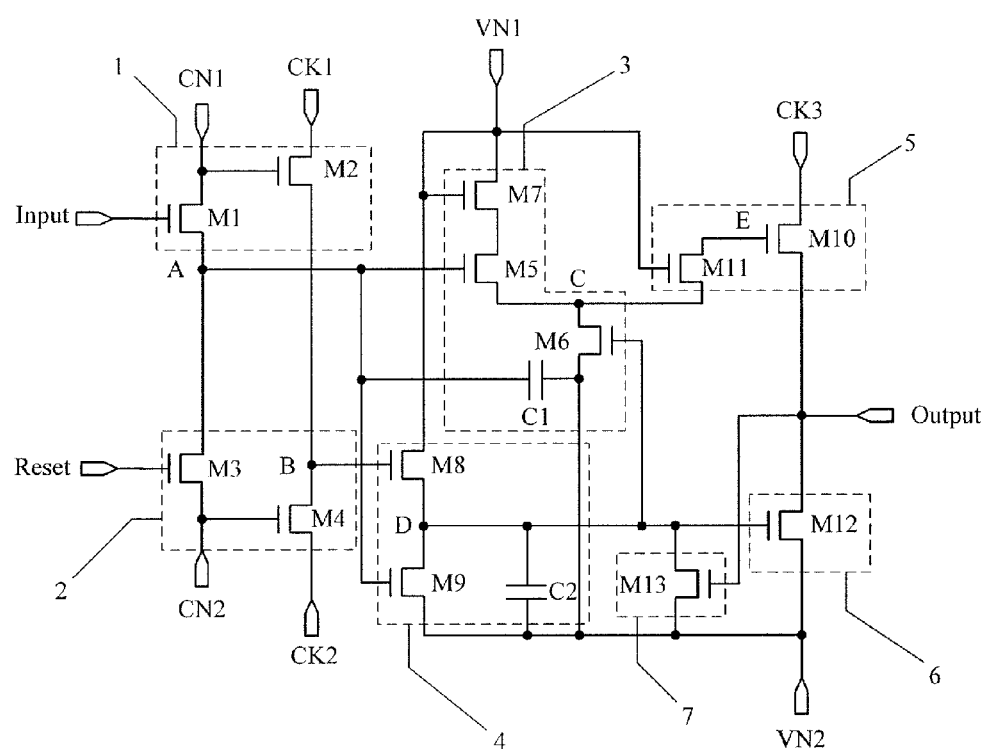
FIG. 3a is a schematic diagram of a structure of the shift register shown in FIG. 1b.
Figure 3B:
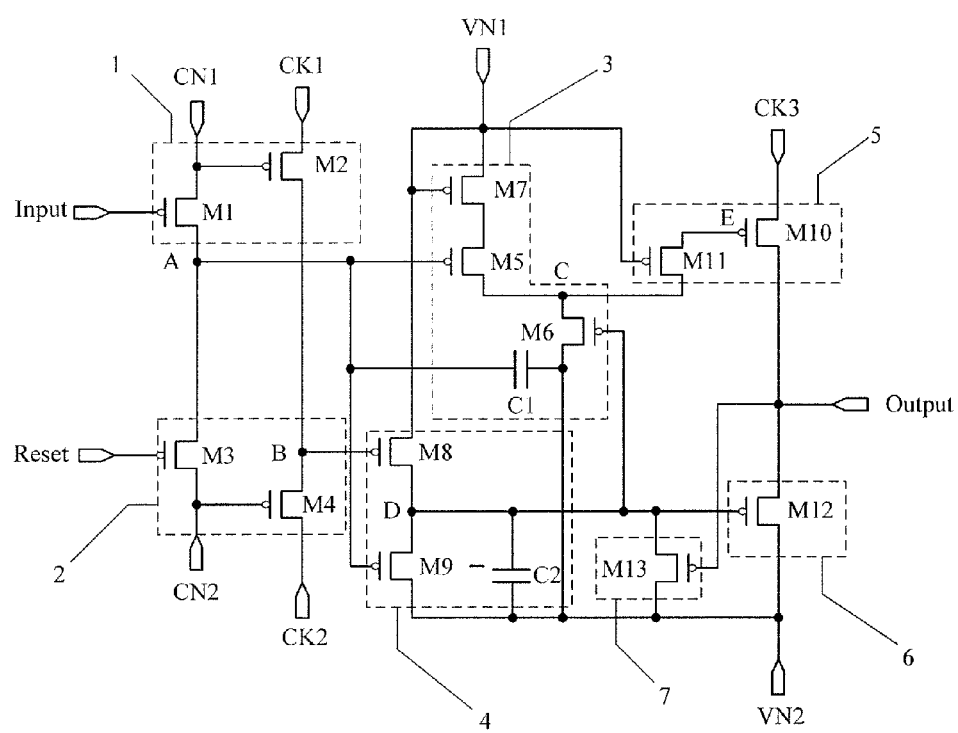
FIG. 3b is a schematic diagram of another structure of the shift register shown in FIG. 1b.

When a signal from the input signal terminal Input is a high potential, as shown in FIGS. 2a and 3a, the first switching transistor M1 and the second switching transistor M2 may be N-type switching transistors; or, when a signal from the input signal terminal Input is a low potential, as shown in FIGS. 2b and 3b, the first switching transistor M1 and the second switching transistor M2 may be P-type switching transistors. As to the type of the switching transistors, no limitations are made herein.

Further, when the first switching transistor M1 is in a turned-on status under control of the input signal terminal Input, a signal from the first reference signal terminal CN1 is supplied to the first node A, and when the second switching transistor M2 is in a turned-on status under control of the input signal terminal Input, a signal from the first clock signal terminal CK1 is supplied to the second node B.

The above are only illustrative descriptions of the structure of the input module of the shift register. The structure of the input module is not limited to the above described structure, it may be other structures, and no limitations are made herein.

In the shift register provided by the embodiment of the present disclosure, as shown in FIGS. 2a to 3b, the reset module 2 may include a third switching transistor M3 and a fourth switching transistor M4, wherein a gate of the third switching transistor M3 is connected to the reset signal terminal Reset, a source thereof is connected to the first node A and a drain thereof is connected to the second reference signal terminal CN2; and a gate of the fourth switching transistor M4 is connected to the second reference signal terminal CN2, a source thereof is connected to the second node B and a drain thereof is connected to the second clock signal terminal CK2.

When a signal from the input signal terminal Input is a high potential, as shown in FIGS. 2a and 3a, the third switching transistor M3 and the fourth switching transistor M4 may be N-type switching transistors; or, when a signal from the input signal terminal Input is a low potential, as shown in FIGS. 2b and 3b, the third switching transistor M3 and the fourth switching transistor M4 may be P-type switching transistors. As to the type of the switching transistors, no limitations are made herein.

Further, when the third switching transistor M3 is in a turned-on status under control of the reset signal terminal Reset, a signal from the second reference signal terminal CN2 is supplied to the first node A, and when the fourth switching transistor M4 is in a turned-on status under control of the second reference signal terminal CN2, a signal from the second clock signal terminal CK2 is supplied to the second node B.

The above are only illustrative descriptions of the structure of the reset module of the shift register. The structure of the reset module is not limited to the above described structure, it may be other structures, and no limitations are made herein.

In the shift register provided by an embodiment of the present disclosure, as shown in FIGS. 2a and 2b, the first control module 3 may include a fifth switching transistor M5, a sixth switching transistor M6 and a first capacitor C1, wherein a gate of the fifth switching transistor M5 is connected to the first node A, a source thereof is connected to the first DC signal terminal VN1 and a drain thereof is connected to the third node C; a gate of the sixth switching transistor M6 is connected to the fourth node D, a source thereof is connected to the third node C and a drain thereof is connected to the second DC signal terminal VN2; one terminal of the first capacitor C1 is connected to the first node and the other terminal thereof is connected to the second DC signal terminal VN2.

When a signal from the input signal terminal Input is a high potential, as shown in FIGS. 2a and 3a, the fifth switching transistor M5 and the sixth switching transistor M6 may be N-type switching transistors; or, when a signal from the input signal terminal Input is a low potential, as shown in FIGS. 2b and 3b, the fifth switching transistor M5 and the sixth switching transistor M6 may be P-type switching transistors. As to the type of the switching transistors, no limitations are made herein.

Further, when the fifth switching transistor M5 is in a turned-on status under control of the first node A, a signal from the first DC signal terminal VN1 is supplied to the third node C, and when the sixth switching transistor M6 is in a turned-on status under control of the fourth node D, a signal from the second DC signal terminal VN2 is supplied to the third node C, and a potential at the first node A is maintained in a stable status due to action of the first capacitor C1 when the first node A is in a floating status.

Further, in the shift register provided by the embodiment of the present disclosure, as shown in FIGS. 3a and 3b, the first control module 3 may further include a seventh switching transistor M7 connected between the source of the fifth switching transistor M5 and the first DC signal terminal VN1, wherein a gate and a source of the seventh switching transistor M7 are both connected to the first DC signal terminal VN1 and a drain thereof is connected to the source of the fifth switching transistor M5.

A GOA circuit comprises a plurality of shift registers, the shift registers in each stage are all connected to the same first DC signal terminal. When shift registers in a certain stage cause the potential at the first node and the potential at the third node to jump due to external factors and cause a voltage between the gate and the source of the fifth switching transistor to change largely, if no seventh switching transistor is provided, it will cause the voltage at the first DC signal terminal to be unstable, and accordingly cause the signal from the first DC signal terminal as received by the shift registers in the remaining respective stages to be unstable, and further lead to abnormality of input and output of the entire GOA circuit. Thus, a seventh switching transistor may be provided, and the gate and the source of the seventh switching transistor may be both connected to the first DC signal terminal, so that the seventh switching transistor has a unidirectional conducting function of a diode, that is, the signal from the first DC signal terminal may be supplied to the source of the fifth switching transistor via the seventh switch switching transistor, meanwhile interference on the signal from the first DC signal terminal caused by the gate and the source of the fifth switching transistor can be avoided. Thus, it is ensured that the signal outputted from the first DC signal terminal is in a stable status, and further, the signal received by the shift registers in the remaining respective stages at the corresponding first DC signal terminals is in a stable status, and accordingly, stability of an output of the shift register is improved.

When a signal from the input signal terminal Input is a high potential, as shown in FIG. 3a, the seventh switching transistor M7 may be an N-type switching transistor; or, when a signal from the input signal terminal Input is a low potential, as shown in FIG. 3b, the seventh switching transistor M7 may be a P-type switching transistor. As to the type of the switching transistor, no limitations are made herein.

Further, when the seventh switching transistor M7 is in a turned-on status under control of the first DC signal terminal VN1, a signal from the first DC signal terminal VN1 is supplied to the source of the fifth switching transistor M5.

The above are only illustrative descriptions of the structure of the first control module of the shift register. The structure of the first control module is not limited to the above described structure, it may be other structures, and no limitations are made herein.

In the shift register provided by the embodiment of the present disclosure, as shown in FIGS. 2a to 3b, the second control module 4 may include an eighth switching transistor M8, a ninth switching transistor M9 and a second capacitor C2, wherein a gate of the eighth switching transistor M8 is connected to the second node B, a source thereof is connected to the first DC signal terminal VN1 and a drain thereof is connected to the fourth node D; a gate of the ninth switching transistor M9 is connected to the first node A, a source thereof is connected to the fourth node D and a drain thereof is connected to the second DC signal terminal VN2; one terminal of the second capacitor C2 is connected to the fourth node D and the other terminal thereof is connected to the second DC signal terminal VN2.

When a signal from the input signal terminal Input is a high potential, as shown in FIGS. 2a and 3a, the eighth switching transistor M8 and the ninth switching transistor M9 may be N-type switching transistors; or, when a signal from the input signal terminal Input is a low potential, as shown in FIGS. 2b and 3b, the eighth switching transistor M8 and the ninth switching transistor M9 may be P-type switching transistors. As to the type of the switching transistors, no limitations are made herein.

Further, when the eighth switching transistor M8 is in a turned-on status under control of the second node B, a signal from the first DC signal terminal VN1 is supplied to the fourth node D, and when the ninth switching transistor M9 is in a turned-on status under control of the first node A, a signal from the second DC signal terminal VN2 is supplied to the fourth node D, and a potential at the fourth node D is maintained in a stable status due to action of the second capacitor C2 when the fourth node D is in a floating status.

The above are only illustrative descriptions of the structure of the second control module of the shift register. The structure of the second control module is not limited to the above described structure, it may be other structures, and no limitations are made herein.

In the shift register provided by the embodiment of the present disclosure, as shown in FIGS. 2a and 2b, the first output module 5 may include a tenth switching transistor M10, wherein a gate of the tenth switching transistor M10 is connected to the third node C, a source thereof is connected to the third clock signal terminal CK3 and a drain thereof is connected to the driving signal output terminal Output.

When a signal from the input signal terminal Input is a high potential, as shown in FIG. 2a, the tenth switching transistor M10 may be an N-type switching transistor; or, when a signal from the input signal terminal Input is a low potential, as shown in FIG. 2b, the tenth switching transistor M10 may be a P-type switching transistor. As to the type of the switching transistor, no limitations are made herein.

Further, when the tenth switching transistor M10 is in a turned-on status under control of the third node C, a signal from the third clock signal terminal CK3 is supplied to the driving signal output terminal Output.

Further, as compared with the other switching transistors, a production size of the tenth switching transistor is usually larger, i.e., parasitic capacitance of the tenth switching transistor per se is larger. Thus, when the third node is in a floating status, parasitic capacitance of the tenth switching transistor per se may be used to control the potential at the third node.

Further, in the shift register provided by an embodiment of the present disclosure, as shown in FIGS. 3a and 3b, the first output module 5 may further include an eleventh switching transistor M11 connected between the gate of the tenth switching transistor M10 and the third node C, wherein a gate of the eleventh switching transistor M11 is connected to the first DC signal terminal VN1, a source thereof is connected to the gate of the tenth switching transistor M10 and a drain thereof is connected to the third node C.

A relatively large size of the tenth switching transistor M10 causes parasitic capacitance to be also relatively large. Thus, when the third node C is in a floating status, a bootstrap effect of the tenth switching transistor M10 causes the potential at the gate E of the tenth switching transistor M10 and the potential at the source of the eleventh switching transistor M11 to be further pulled up. A voltage difference between the gate and the source of the eleventh switching transistor M11 is not sufficient to turn it on, so that the eleventh switching transistor M11 turns itself off, which effectively ensures that the potential at the gate E of the tenth switching transistor M10 will not be provided to the third node C via the eleventh switching transistor M11, so as to ensure that the potential at the third node C is in a stable status, and effectively ensure that the potential at the gate E of the tenth switching transistor M10 is maintained as a pulled-up status, so as to ensure that the tenth switching transistor M10 is turned on and a signal from the third clock signal terminal CK3 is supplied to the driving signal output terminal Output, thereby noise of a scanning signal output of the driving signal output terminal Output is reduced, and stability of an output of the driving signal output terminal Output is improved.

When a signal from the input signal terminal Input is a high potential, as shown in FIG. 3a, the eleventh switching transistor M11 may be an N-type switching transistor; or, when a signal from the input signal terminal Input is a low potential, as shown in FIG. 3b, the eleventh switching transistor M11 may be a P-type switching transistor. As to the type of the switching transistor, no limitations are made herein.

Further, when the eleventh switching transistor M11 is in a turned-on status under control of the first DC signal terminal VN1, the potential at the third node C is supplied to the gate of the tenth switching transistor M10.

The above are only illustrative descriptions of the structure of the first output module of the shift register. The structure of the first output module is not limited to the above described structure, it may be other structures, and no limitations are made herein.

In the shift register provided by the embodiment of the present disclosure, as shown in FIGS. 2a to 3b, the second output module 6 may include a twelfth switching transistor M12, wherein a gate of the twelfth switching transistor M12 is connected to the fourth node D, a source thereof is connected to the driving signal output terminal Output and a drain thereof is connected to the second DC signal terminal VN2.

When a signal from the input signal terminal Input is a high potential, as shown in FIGS. 2a and 3a, the twelfth switching transistor M12 may be an N-type switching transistor; or, when a signal from the input signal terminal Input is a low potential, as shown in FIGS. 2b and 3b, the twelfth switching transistor M12 may be a P-type switching transistor. As to the type of the switching transistor, no limitations are made herein.

Further, when the twelfth switching transistor M12 is in a turned-on status under control of the fourth node D, a signal from the second DC signal terminal VN2 is supplied to the driving signal output terminal Output.

The above are only illustrative descriptions of the structure of the second output module of the shift register. The structure of the first control module is not limited to the above described structure, it may be other structures, and no limitations are made herein.

In the shift register provided by the embodiment of the present disclosure, as shown in FIGS. 3a and 3b, the noise reduction module 7 may include a thirteenth switching transistor M13, a gate of the thirteenth switching transistor M13 is connected to the driving signal output terminal Output, a source thereof is connected to the fourth node D and a drain thereof is connected to the second DC signal terminal VN2.

When a signal from the input signal terminal Input is a high potential, as shown in FIG. 3a, the thirteenth switching transistor M13 may be an N-type switching transistor; or, when a signal from the input signal terminal Input is a low potential, as shown in FIG. 3b, the thirteenth switching transistor M13 may be a P-type switching transistor. As to the type of the switching transistor, no limitations are made herein.

Further, when the thirteenth switching transistor M13 is in a turned on status under control of the driving signal output terminal Output, a signal from the second DC signal terminal VN2 signal is supplied to the fourth node D. As such, when the first output module 5 makes a scanning signal output outputted by the driving signal output terminal Output be a valid signal under control of the third node C, the thirteenth switching transistor M13 is turned on and a signal from the second DC signal terminal signal VN2 is supplied to the fourth node D, which further ensures that the twelfth switching transistor M12 is in a turned-off status, and accordingly ensures that the potential at the fourth node D is in a stable status, thereby noise of a scanning signal output of the driving signal output terminal Output is reduced, and stability of an output of the driving signal output terminal Output is improved.

The above are only illustrative descriptions of the structure of the noise reduction module of the shift register. The structure of the first control module is not limited to the above described structure, it may be other structures, and no limitations are made herein.

In the shift register provided in the embodiment of the present disclosure, the switching transistors may adopt transistors made from the same material. When an effective pulse signal of an input signal is a high potential, all the switching transistors may be N-type transistors; or, when an effective pulse signal of an input signal is a low potential, all the switching transistors may be P-type transistors. An N-type switching transistor is turned on under action of a high potential and is turned off under action of a low potential; a P-type switching transistor is turned off under action of a high potential and is turned on under action of a low potential.

It should be noted that each of the switching transistors referred to in the above embodiments of the present disclosure may be a Metal Oxide Semiconductor (MOS). According to a type of the transistor and a different input signal, the functions of the source and drain of these transistors may be interchanged, no differentiation is made herein.

Further, in the shift register provided in the embodiment of the present disclosure, the input module and the reset module are designed symmetrically, which can effectuate function interchangeability. Accordingly, the shift register provided by the embodiment of the present disclosure can implement a bidirectional scanning.

During a backward scanning, functions of the input module and the reset module of the shift register are interchanged, that is, with respect to a forward scanning, a reset module is taken as an input module, a reset signal terminal is taken as an input signal terminal, an input module is taken as a reset module, an input signal terminal is taken as a reset signal terminal.

When a valid pulse signal of the reset signal outputted by the reset signal output terminal is a high potential, the potential of the first DC signal outputted by the first DC signal output terminal is a high potential, the potential of the second DC signal outputted by the second DC signal output terminal is a low potential, the potential of the first reference signal outputted by the first reference signal output terminal is a low potential, the potential of the second reference signal outputted by the second reference signal output terminal is a high potential; or, when a valid pulse signal of the reset signal outputted by the reset signal output terminal is a low potential, the potential of the first DC signal is a low potential, the potential of the second DC signal is a high potential, the potential of the first reference signal is a high potential, the potential of the second reference signal is a low potential.

In addition, when a valid pulse signal of the reset signal is a high potential, a rising edge of the reset signal and a rising edge of the first clock signal and a falling edge of the third clock signal are aligned, a falling edge of the reset signal and a falling edge of the first clock signal are aligned, a falling edge of the second clock signal and a rising edge of the third clock signal are aligned; or, when a valid pulse signal of the reset signal is a low potential, a falling edge of the reset signal and a falling edge of the first clock signal and a rising edge of the third clocks signal are aligned, a rising edge of the reset signal and a rising edge of the first clock signal are aligned, a rising edge of the second clock signal and a falling edge of the third clock signal are aligned.

Hereinafter, an operating process of the shift register provided by the embodiment of the present disclosure will be explained in combination with circuit timing diagrams and with the forward scanning as an example. During the forward scanning, the second reference signal is at a low potential, the fourth switching transistor has always been in the turned-off status. Thus, the fourth switching transistor cannot provide the second clock signal to the second node, that is, the second clock signal does not work during the operating process of the shift register. In the following description, 1 represents a high potential signal, 0 represents a low potential signal, input represents an input signal, reset represents a reset signal, output represents a scanning signal, ck1 represents a first clock signal, ck3 represents a third clock signal, cn1 represents a first reference signal, cn2 represents a second reference signal, viii a first DC signal and vn2 represents the second reference signal.

First Example

An operating process of the shift register will be described below with the shift register shown in FIG. 2a as an example.

In the shift register shown in FIG. 2a, all the switching transistors are N-type switching transistors, each of the N-type switching transistors being tuned on under action of a high potential and being turned off under action of a low potential, the potential of the first DC signal vn1 is a high potential, the potential of the second DC signal vn2 is a low potential, the potential of the first reference signal cn1 is a high potential and the potential of the second reference signal cn2 is a low potential.

Figure 4A:
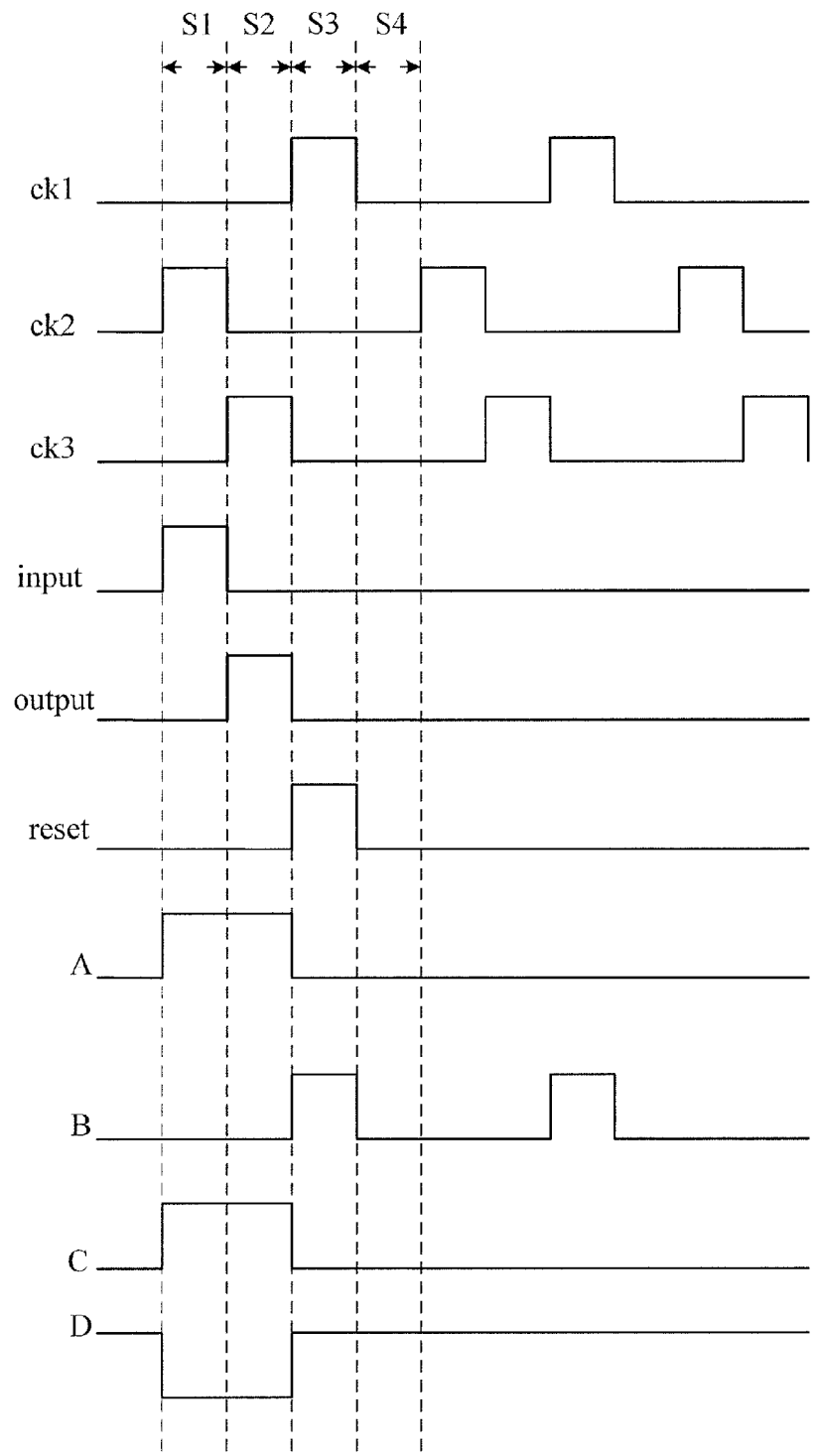

An input output timing diagram corresponding to the shift register shown in FIG. 2a is as shown in FIG. 4a, wherein four stages of an input stage S1, an output stage S2, a reset stage S3 and a reset maintenance stage S4 are selected for the description.

In the input stage S1, ck1=0, ck3=0, input=1, reset=0.

Since reset=0, the third switching transistor M3 is turned off. Since the potential of the first reference signal cn1 is a high potential, the second switching transistor M2 is turned on. Since ck1=0, and the second switching transistor M2 is turned on and supplies the first clock signal ck1 to the second node B, the potential at the second node B is a low potential, which causes the eighth switching transistor M8 to be turned off. Since input=1, the first switching transistor M1 is turned on and supplies the first reference signal cn1 with a high potential to the first node A, so that the potential at the first node A is a high potential, the capacitor C1 starts to charge and maintains the potential at the first node A in a stable status. Since the potential at the first node A is a high potential, the fifth switching transistor M5 and the ninth switching transistor M9 are both turned on. Since the ninth transistor M9 is turned on and supplies the second DC signal vn2 with a low potential to the fourth node D, the potential at the fourth node D is a low potential, which causes the sixth switching transistor M6 and the twelfth switching transistor M12 to be both turned off. Since the fifth switching transistor M5 is turned on and supplies the first DC signal vn1 with a high potential to the third node C, the potential at the third node C is a high potential, which causes the tenth switching transistor M10 to be turned on. Since ck3=0, and the tenth switching transistor M10 is turned on and the third clock signal ck3 is supplied to the driving signal output terminal Output, so the driving signal output terminal Output outputs a scanning signal output with a low potential.

In the output stage S2, ck1=0, ck3=1, input=0, reset=0.

Since reset=0, so the third switching transistor M3 is turned off. Since the potential of the first reference signal cn1 is a high potential, so the second switching transistor M2 is turned on. Since ck1=0, and the second switching transistor M2 is turned on and supplies the first clock signal ck1 to the second node B, so the potential at the second node B is a low potential, which causes the eighth switching transistor M8 to be turned off. Since input=0, so the first switching transistor M1 is turned off. Since the first switching transistor M1 and the third switching transistor M3 are both turned off, so the first node A is in a floating status. In this case, due to the action of the first capacitor C1, the potential at the first node A is maintained as a high potential as that in the stage S1, which causes the fifth switching transistor M5 and the ninth switching transistor M9 to be both turned on. Since the ninth transistor M9 is turned on and supplies the second DC signal vn2 with a low potential to the fourth node D, so the potential at the fourth node D is a low potential, which causes the sixth switching transistor M6 and the twelfth switching transistor M12 to be both turned off. Since the fifth switching transistor M5 is turned on and supplies the first DC signal vn1 with a high potential to the third node C, so the potential at the third node C is a high potential, which causes the tenth switching transistor M10 to be turned on. Since ck3=1, and the tenth switch transistor M10 is turned on and the third clock signal ck3 is supplied to the driving signal output terminal Output, so the driving signal output terminal Output outputs a scanning signal output with a high potential.

In the reset phase S3, ck1=1, ck3=0, input=0, reset=1.

Since input=0, so the first switching transistor M1 is turned off. Since reset=1, so the third switching transistor M3 is turned on. Since the third switching transistor M3 is turned on and supplies the second reference signal cn2 with a low potential to the first node A, so the potential at the first node A is a low potential, which causes the fifth switching transistor M5 and the ninth switching transistor M9 to be both turned off. Since potential of the first reference signal cn1 is a high potential, so the second switching transistor M2 is turned on. Since ck1=1, and the second switching transistor M2 is turned on and supplies the first clock signal ck1 to the second node B, so the potential at the second node B is a high potential, which causes the eighth switching transistor M8 to be turned on. Since the eighth switching transistor M8 is turned on and supplies the first DC signal vn1 with a high potential to the fourth point D, so the potential at the fourth node D is a high potential, in this case, the second capacitor C2 starts to charge to maintain the potential at the fourth node D in a stable status. Since the potential at the fourth node D is a high potential, so the sixth switching transistor M6 and the twelfth switch transistor M12 are both turned on. Since the sixth switching transistor M6 is turned on and supplies the second DC signal vn2 with a low potential to the third node C, so the potential at the third node C is a low potential, which causes the tenth switching transistor M10 to be turned off. Since the twelfth switching transistor M12 is turned on and supplies the second DC signal vn2 with a low potential to the driving signal output terminal Output, so the driving signal output terminal Output outputs a scanning signal output with a low potential.

In the reset maintenance stage S4, ck1=0, ck3=0, input=0, reset=0.

Since input=0, so the first switching transistor M1 is turned off. Since reset=0, so the third switching transistor M3 is turned off. The first switching transistor M1 and the third switching transistor M3 are both turned off, so the first node A is in a floating status. In this case, due to a bootstrap effect of the fifth switching transistor M5, the potential at the first node A is maintained as a low potential, to ensure that the fifth switching transistor M5 and the ninth switching transistor M9 are both turned off in this stage. Since the potential of the first reference signal cn1 is a high potential, so the second switching transistor M2 is turned on. Since ck1=0, and the second switching transistor M2 is turned on and supplies the first clock signal ck1 to the second node B, so the potential at the second node B is a low potential, which causes the eighth switching transistor M8 to be turned off, and the fourth point D to be in a floating status. In this case, due to the action of the second capacitor C2, the potential at the fourth node D is maintained as a high potential as that in the stage S3, to ensure that the sixth switching transistor M6 and the twelfth switch transistor M12 are both turned on and in this stage. Since the sixth switching transistor M6 is turned on and supplies the second DC signal vn2 with a low potential to the third node C, so the potential at the third node C is a low potential, which causes the tenth switching transistor M10 to be turned off. Since the twelfth switching transistor M12 is turned on and supplies the second DC signal vn2 with a low potential to the driving signal output terminal Output, so the driving signal output terminal Output outputs a scanning signal output with a low potential.

In the shift register provided in the embodiment of the present disclosure, after the reset maintenance stage, once ck1=1, the second capacitor starts to charge. When ck1=0, the second capacitor maintains the potential at the fourth node in a stable status of a high potential, so that the sixth switching transistor is turned on and supplies the second DC signal with a low potential to the third node, which thereby causes the potential of the third node to be a low potential, the tenth switching transistor is therefore turned off; meanwhile, the twelfth switching transistor is turned on and supplies the second DC signal with a low potential to the driving signal output terminal, and the driving signal output terminal thereby stably outputs a scanning signal with a low potential, until the next frame starts.

In the shift register provided in the embodiment of the present disclosure, in the input stage, the potential at the first node is maintained in a stable status via the first capacitor, so that the potential at the third node is in a stable status; in the output stage, the potential at the fourth node is made in a stable status via the first node and the ninth switching transistor, without affecting the potential at the third node; in the reset maintenance stage, the potential at the fourth node is maintained in a stable status via the second capacitor, without affecting the potential at the third node, so as to ensure a stable output of the scanning signal from the driving signal output terminal of the shift register, thereby noise of the scanning signal is reduced, and stability of the output of the shift register is improved.

Second Example

An operating process of the shift register will be described below with the shift register shown in FIG. 3a as an example.

In the shift register shown in FIG. 3a, all the switching transistors are N-type switching transistors, each of the N-type switching transistors being tuned on under action of a high potential and being turned off under action of a low potential, the potential of the first DC signal vn1 is a high potential, the potential of the second DC signal vn2 is a low potential, the potential of the First reference signal cn1 is a high potential and the potential of the second reference signal cn2 is a high potential.

Figure 4B:
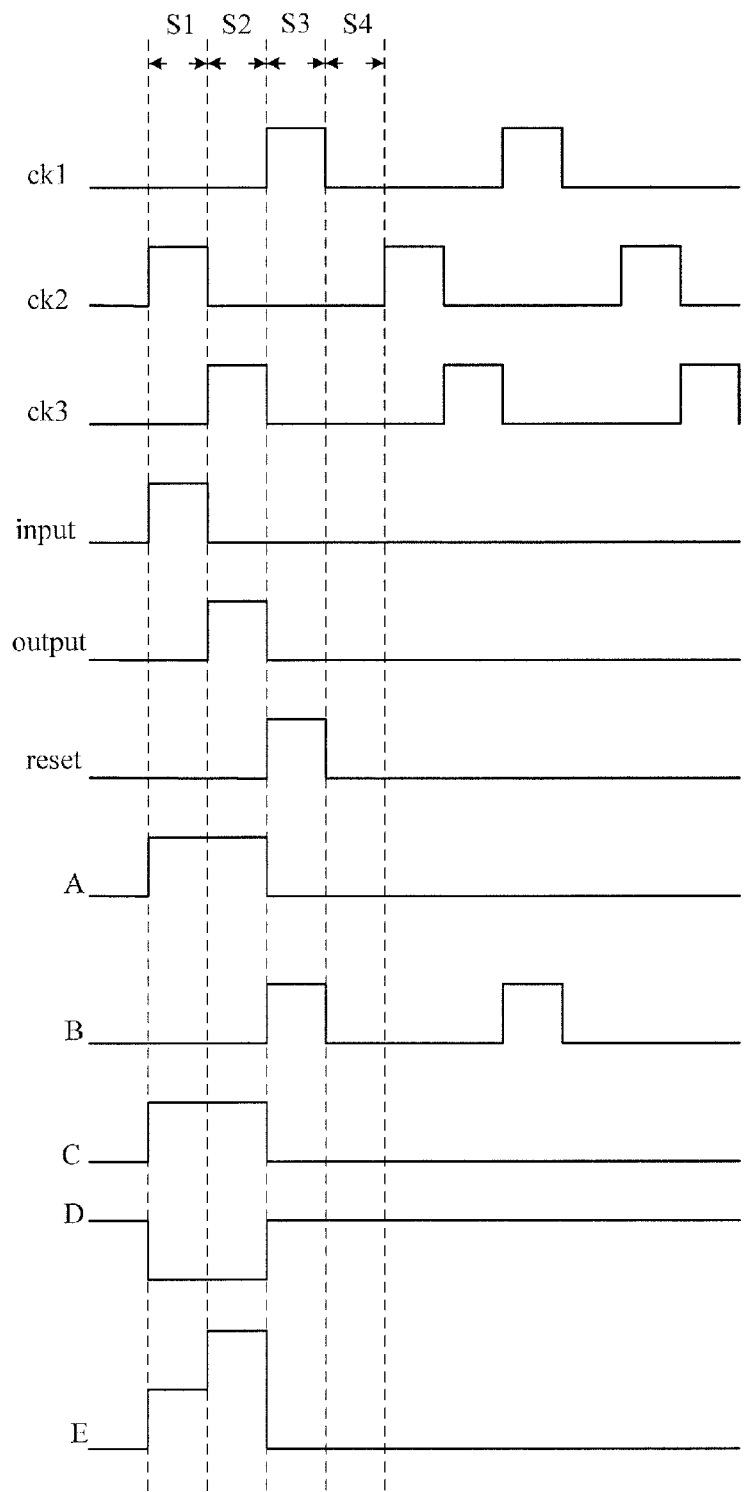
FIG. 4b is a circuit timing diagram of the shift register shown in FIG. 2b.
Figure 4C:
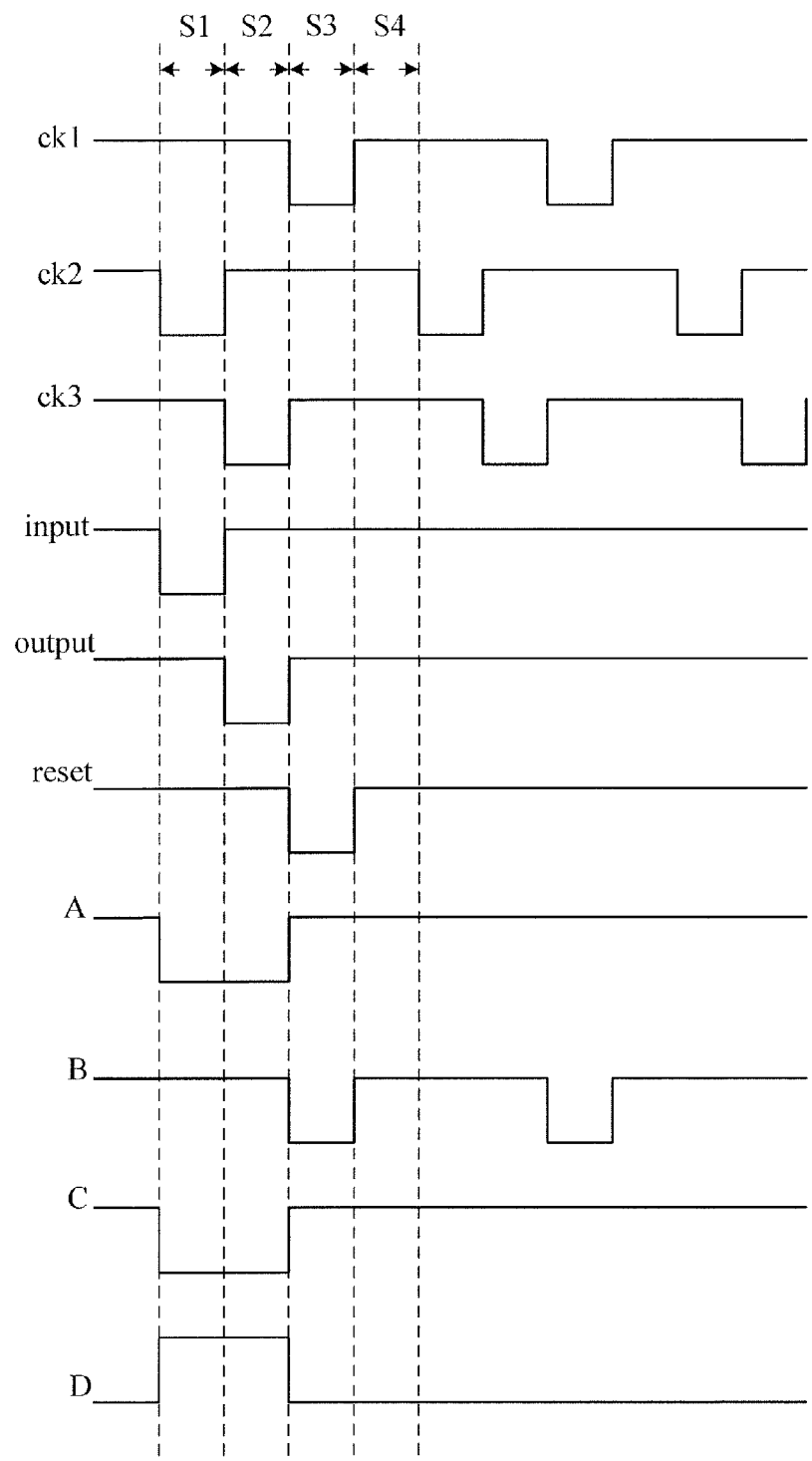

An input output timing diagram corresponding to the shift register shown in FIG. 3a is as shown in FIG. 4b, wherein four stages of an input stage S1, an output stage S2, a reset stage S3 and a reset maintenance stage S4 are selected for the description.

In the four stages of the input stage S1, the output stage S2, the reset stage S3 and the reset maintenance stage S4, since the potential of the first DC signal vn1 is a high potential, so the seventh switching transistor M7 and the eleventh switching transistor M11 are both turned on.

In the input stage S1, ck1=0, ck3=0, input=1, reset=0.

Since reset=0, so the third switching transistor M3 is turned off. Since the potential of the first reference signal cn1 is a high potential, so the second switching transistor M2 is turned on. Since ck1=0, and the second switching transistor M2 is turned on and supplies the first clock signal ck1 to the second node B, so the potential at the second node B is a low potential, which causes the eighth switching transistor M8 to be turned off. Since input=1, so the first switching transistor M1 is turned on and supplies the first reference signal cn1 with a high potential to the first node A, so the potential at the first node A is a high potential. In this case, the capacitor C1 starts to charge and maintains the potential at the first node A in a stable status. Since the potential at the first node A is a high potential, so the fifth switching transistor M5 and the ninth switching transistor M9 are both turned on. Since the ninth transistor M9 is turned on and supplies the second DC signal vn2 with a low potential to the fourth node D, so the potential at the fourth node D is a low potential, which causes the sixth switching transistor M6 and the twelfth switching transistor M12 to be both turned off. Since the seventh switching transistor M7 is turned on and supplies the first DC signal vn1 with a high potential to the source of the fifth the fifth switching transistor M5, and switching transistor M5 is turned on and supplies the first DC signal vn1 with a high potential to the third node C, so the potential at the third node C is a high potential, which causes the ninth switching transistor M9 and the tenth switching transistor M10 to be turned on. Since the eleventh switching transistor M11 is turned on and supplies the potential at the third node C to the gate E of the tenth switching transistor M10, so the potential at the gate E of the tenth switching transistor M10 is a high potential, so that the tenth switching transistor is turned on. Since ck3=0, and the tenth switching transistor M10 is turned on and the third clock signal ck3 is supplied to the driving signal output terminal Output, so the driving signal output terminal Output outputs a scanning signal output with a low potential, and the thirteenth switching transistor M113 is turned off.

In the output stage S2, ck1=0, ck3=1, input=0, reset=0.

Since reset=0, so the third switching transistor M3 is turned off. Since the potential of the first reference signal cn1 is a high potential, so the second switching transistor M2 is turned on. Since ck1=0, and the second switching transistor M2 is turned on and supplies the first clock signal ck1 to the second node B, so the potential at the second node B is a low potential, which causes the eighth switching transistor M8 to be turned off. Since input=0, so the first switching transistor M1 is turned off. Since the first switching transistor M1 and the third switching transistor M3 are both turned off, so the first node A is in a floating status. In this case, due to the action of the first capacitor C1, the potential at the first node A is maintained as a high potential as that at the stage S1, so as to ensure that the fifth switching transistor M5 and the ninth switching transistor M9 to be both turned on in this stage. Since the ninth transistor M9 is turned on and supplies the second DC signal vn2 with a low potential to the fourth node D, so the potential at the fourth node D is a low potential, which causes the sixth switching transistor M6 and the twelfth switching transistor M12 to be both turned off. Since the seventh transistor M7 is turned on and supplies the first DC signal vn1 with a high potential to the source of the fifth switching transistor M5, and the fifth switching transistor M5 is turned on and supplies the first DC signal vn1 with a high potential to the third node C, so the potential at the third node C is a high potential. Since a size of the tenth switching transistor M10 is relatively large, so a resulted parasitic capacitance is also relatively large. Because of a bootstrap effect of the tenth switching transistor M10, so the potential at the gate E of the tenth switching transistor M10 is further pulled up, which causes the tenth switching transistor M10 to be turned on. A voltage difference between the gate and the source of the eleventh switching transistor M11 is not sufficient to turn the eleventh switching transistor M11 on, so the eleventh switching transistor M11 shuts itself down, this effectively ensures that the potential at the gate E of the tenth switching transistor M10 will not be provided to the third node C via the eleventh switching transistor M11, so as to ensure that the potential at the third node C is in a stable status. Further, this also avoids affecting a life length of the sixth switching transistor M6 because of a large voltage difference between two ends thereof. Since ck3=1, and the tenth switch transistor M10 is turned on and supplies the third clock signal ck3 to the driving signal output terminal Output, so the driving signal output terminal Output outputs a scanning signal output with a high potential, so that the thirteenth switching transistor M13 is turned on and supplies the second DC signal vn2 with a low potential to the fourth node D, thereby noise of a scanning signal output of the driving signal output terminal Output is reduced, and stability of an output of the driving signal output terminal Output is improved.

In the reset phase S3, ck1=1, ck3=0, input=0, reset=1.

Since input=0, so the first switching transistor M1 is turned off. Since reset=1, so the third switching transistor M3 is turned on. And the second reference signal cn2 with a low potential is supplied to the first node A, so the potential at the first node A is a low potential, which thereby causes the fifth switching transistor M5 and the ninth switching transistor M9 to be both turned off. Since potential of the first reference signal cn1 is a high potential, so the second switching transistor M2 is turned on. Since ck1=1 and the second switching transistor M2 is turned on and supplies the first clock signal ck1 to the second node B, so the potential at the second node B is a high potential, which causes the eighth switching transistor M8 to be turned on and to supply the first DC signal vn1 with a high potential to the fourth node D, so the potential at the fourth node D is a high potential. In this case, the second capacitor C2 starts to charge to maintain the potential at the fourth node D in a stable status. Since the potential at the fourth node D is a high potential, the sixth switching transistor M6 and the twelfth switch transistor M12 are both turned on. Since the sixth switching transistor M6 is turned on and supplies the second DC signal vn2 with a low potential to the third node C, so the potential at the third node C is a low potential. Since the potential at the second node C is a low potential, and the eleventh switching transistor M11 is turned on and supplies the potential at the third node C to the gate E of the tenth switching transistor M10, so the potential at the gate E of the tenth switching transistor M10 is a low potential, which causes the tenth switching transistor M10 to be turned off. Since the twelfth switching transistor M12 is turned on and supplies the second DC signal vn2 with a low potential to the supplied to the driving signal output terminal Output, so the driving signal output terminal Output outputs a scanning signal output with a low potential, which causes the thirteenth switching transistor M13 to be turned off.

In the reset maintenance stage S4, ck1=0, ck3=0, input=0, reset=0.

Since input=0, so the first switching transistor M1 is turned off. Since reset=0, so the third switching transistor M3 is turned off. The first switching transistor M1 and the third switching transistor M3 are both turned off, so the first node A in a floating status. In this case, a bootstrap effect of the fifth switching transistor M5 makes the potential at the first node A be maintained at a low potential, to ensure that the fifth switching transistor M5 and the ninth switching transistor M9 are turned off in this stage. Since the potential of the first reference signal cn1 is a high potential, so the second switching transistor M2 is turned on. Since ck1=0, and the second switching transistor M2 is turned on and supplies the first clock signal ck1 to the second node B, so the potential at the second node B is a low potential, which causes the eighth switching transistor M8 to be turned off, and the fourth point D to be in a floating status. In this case, due to the action of the second capacitor C2, the potential at the fourth node D is maintained as a high potential as that in the stage S3, so that the sixth switching transistor M6 and the twelfth switch transistor M12 are both turned on and in this stage. Since the sixth switching transistor M6 is turned on and supplies the second DC signal vn2 with a low potential to the third node C, so the potential at the third node C is a low potential. Since the potential at the third node C is a low potential, and the eleventh switching transistor M11 is turned on and supplies the potential at the third node to the gate E of the tenth switching transistor M10, so the potential at the gate E of the tenth switching transistor M10 is a low potential, which causes the tenth switching transistor M10 to be turned off. Since the twelfth switching transistor is turned on and supplies the second DC signal vn2 with a low potential to the driving signal output terminal Output, so the driving signal output terminal Output outputs a scanning signal output with a low potential, which causes the thirteenth switching transistor M13 to be turned off.

In the shift register provided in the embodiment of the present disclosure, after the reset maintenance stage, whenever ck1=1, the second capacitor starts to charge. When ck1=0, the second capacitor maintains the potential at the fourth node in a stable status of a high potential, so the sixth switching transistor is turned on and supplies the second DC signal with a low potential to the third node, which in turn causes the potential at the gate of the tenth switching transistor to be a low potential, i.e., which causes the tenth switching transistor to be turned off; meanwhile, the twelfth switching transistor is turned on and supplies the second DC signal with a low potential to the driving signal output terminal, and the driving signal output terminal thereby stably outputs a scanning signal with a low potential, until the next frame starts.

In the shift register provided in the embodiment of the present disclosure, it is further ensured via the seventh switching transistor that the signal outputted by the first DC signal terminal is in a stable status; in the input stage, the potential at the first node is maintained in a stable status via the first capacitor, so that the potential at the third node is in a stable status; at the output stage, the potential at the gate of the tenth switching transistor is made in a stable status being pulled up via the eleventh switching transistor, the potential at the fourth node is made in a stable status via the ninth switching transistor and the thirteenth switching transistor, without affecting the potential at the third node; in the reset maintenance stage, the potential at the fourth node is maintained in a stable status via the second capacitor, without affecting the potential at the third node, so as to ensure a stable output of the scanning signal from the driving signal output terminal of the shift register, thereby noise of the scanning signal is reduced, and stability of the output of the shift register is improved.

Figure 4D:
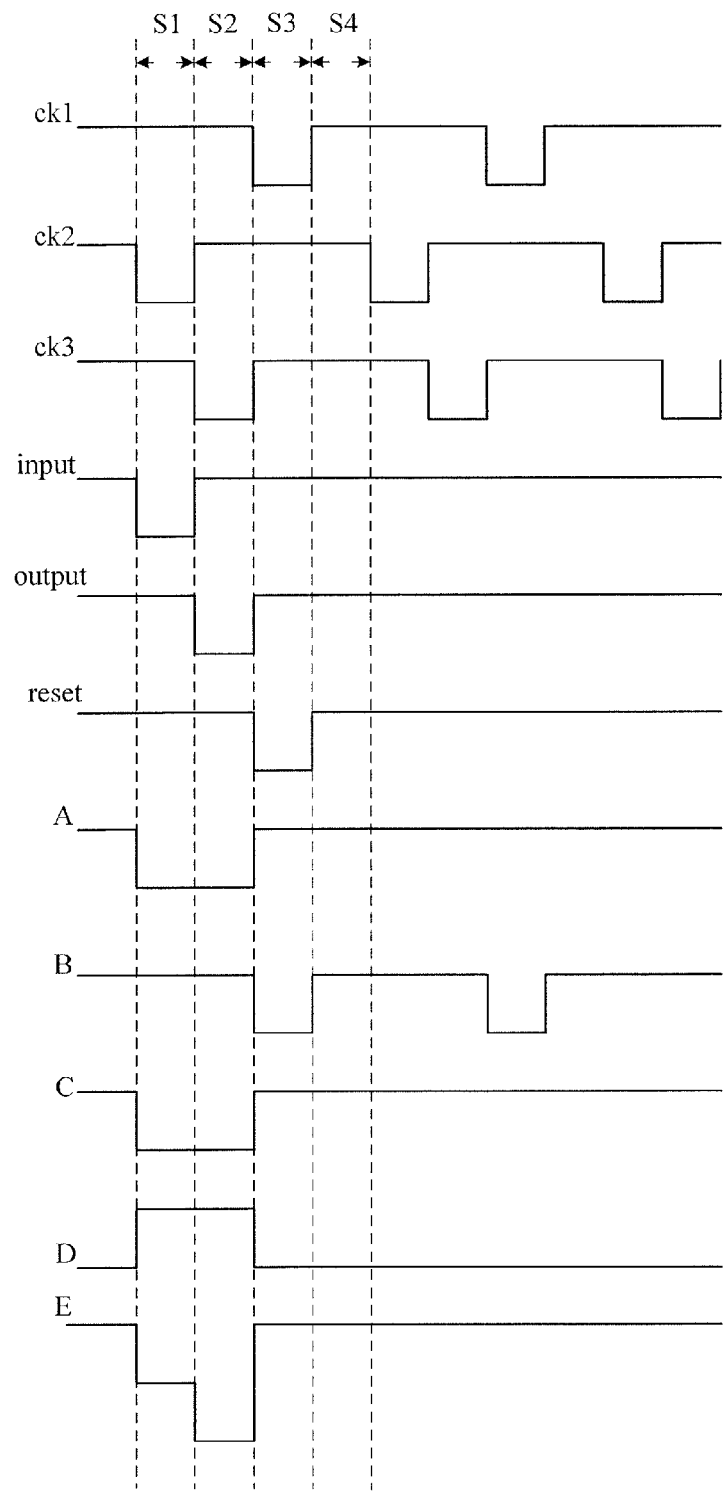
FIG. 4d is a circuit timing diagram of the shift register shown in FIG. 3b.

It should be noted that, in the shift register provided by the embodiment of the present disclosure, as shown in FIGS. 2b and 3b, all the switching transistors may be P-type switching transistors, each of the P-type switching transistors being tuned off under action of a high potential and being turned on under action of a low potential. The operating principles of the shift registers shown in FIGS. 2b and 3b in conjunction with the corresponding input output timing diagrams FIGS. 4a and 4d are the same as those in the First and Second examples, no more details repeated here.

Further, an embodiment of the present disclosure provides a driving method for any of the shift register described above. The driving method comprises an input stage, an output stage, a reset stage and a reset maintenance stage.

In the input stage, the input module supplies a signal from a first reference signal terminal to a first node under control of an input signal terminal and supplies a signal from a first clock signal terminal to a second node under control of the first reference signal terminal, the first control module supplies a signal from a first DC signal terminal to a third node under control of the first node, the second control module supplies a signal from a second DC signal terminal to a fourth node under control of the first node, and a first output signal terminal supplies a signal from a third clock signal terminal to a driving signal output terminal under control of the third node.

In the output stage, the input module supplies a signal from the first clock signal terminal to the second node under control of the first reference signal terminal, the first control module maintains a potential at the first node in a stable status, the second control module supplies a signal from the second DC signal terminal to the fourth node under control of the first node, and the first output module supplies a signal from the third clock signal terminal to the driving signal output terminal under control of the third node.

In the reset stage, the input module supplies a signal from the first clock signal terminal to the second node under control of the first reference signal terminal, the reset module supplies a second reference signal to the first node under control of a reset signal terminal, the first control module supplies a signal from the second DC signal terminal to the third node under control of the fourth node, the second control module supplies a signal from the first DC signal terminal to the fourth node under control of the second node, and the second output module supplies a signal from the second DC signal terminal to the driving signal output terminal under control of the fourth node.

In the reset maintenance stage, the input module supplies a signal from the first clock signal terminal to the second node under control of the first reference signal terminal, the first control module supplies a signal from the second DC signal terminal to the third node under control of the fourth node, the second control module maintains a potential at the fourth node in a stable status, and the second output module supplies a signal from the second DC signal terminal to the driving signal output terminal under control of the fourth node.

Further, in the driving method provided by the embodiment of the present disclosure, in the output stage, the noise reduction module supplies a signal from the second DC signal terminal to the fourth node under control of the driving signal output terminal.

It should be noted that, in the driving method provided by the embodiment of the present disclosure, in the input stage, the first capacitor effectively ensures that the potential at the first node is in a stable status; in the output stage, the ninth switching transistor and the thirteenth switching transistor effectively ensure that the potential at the fourth node is in a stable status; in the reset stage, the second capacitor effectively ensures that the potential at the fourth node is in a stable status. Accordingly, the driving method provided by the embodiment of the present disclosure can ensure a stable output of the scanning signal from the driving signal output terminal of the shift register, thereby reduce noise of the scanning signal, improve stability of the output of the shift register is improved.

Figure 5:
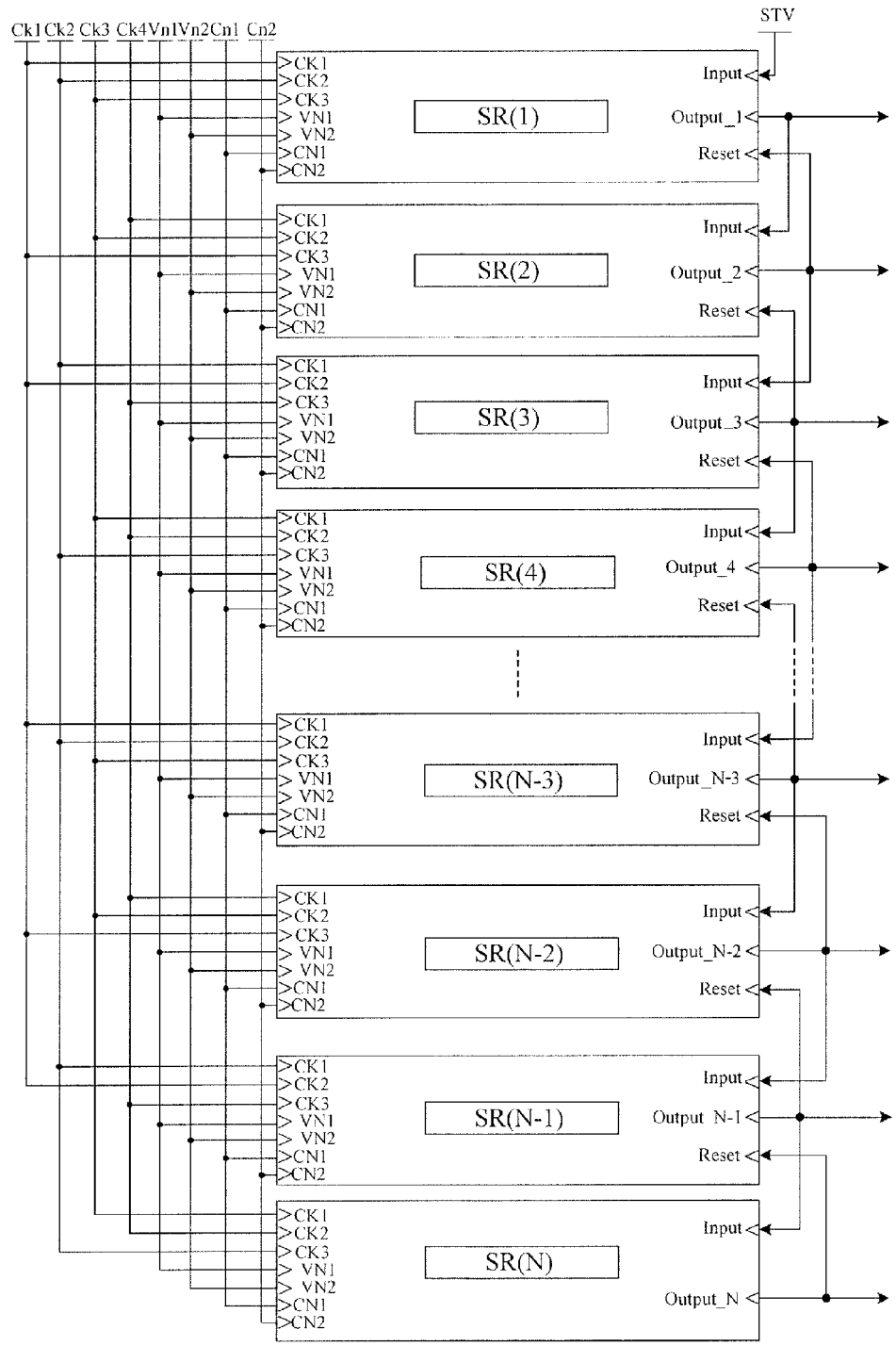
FIG. 5 is a schematic diagram of structure of a gate driving circuit provided by an embodiment of the present disclosure.

In addition, an embodiment of the present disclosure further provides a gate driving circuit, as shown in FIG. 5, the gate driving circuit provided by the embodiment comprises a plurality of cascaded shift registers SR(1), SR(2) . . . SR(n) . . . SR(N−1), SR(N) (N shift registers in total, 1≤n≤N), wherein an input signal terminal Input of a first-stage shift register SR(1) is connected to a frame trigger signal terminal STV; an input signal terminal Input of a shift register SR(n) in each of the remaining stages except the first-stage shift register SR(1) is connected to a driving signal output terminal Output_n−1 of a previous-stage shift register SR(n−1); and a reset signal terminal Reset of a shift register SR(n) in each of the remaining stages except a last-stage shift register is connected to a driving signal output terminal Output_n+1 of a next-stage shift register SR(n+1).

The function and structure of each of the shift registers in the above gate driving circuit are the same as the shift register provided by the embodiments of the present disclosure, and repetition is omitted.

Further, in the gate driving circuit provided by the present disclosure, the shift register in each stage comprises an input module, a reset module, a first control module, a second control module, a first output module and a second output module.

As shown in FIG. 5, in gate driving circuit provided in the present disclosure, the first clock signal terminal CK1 of the (4n−3)-stage shift register, the third clock signal terminal CK3 of the (4n−2)-stage shift register and the second clock signal terminal CK2 of the (4n−1)-stage shift register are connected to the same clock signal terminal CK1; the second clock signal terminal CK2 of the (4n−3)-stage shift register, the first clock signal terminal CK1 of the (4n−1)-stage shift register and the third clock signal terminal CK3 of the 4n-stage shift register are connected to the same clock signal terminal CK2; the third clock signal terminal CK3 of the (4n−3)-stage shift register, the second clock signal terminal CK2 of the (4n−2)-stage shift register and the first clock signal terminal CK1 of the 4n-stage shift register are all connected to the same clock signal terminal CK3; the first clock signal terminal CK1 of the (4n−2)-stage shift register, the third clock signal terminal CK3 of the (4n−1)-stage shift register and the second clock signal terminal CK2 of the 4n-stage shift register are all connected to the same clock signal terminal CK4.

When implementing gate line backward scanning, functions of the input module and reset module of each shift register may be made interchangeable, that is, with respect to a forward scanning, a reset module of each shift register is taken as an input module, a reset signal terminal thereof is taken as an input signal terminal, an input module of each shift register is taken as a reset module, an input signal terminal thereof is taken as a reset signal terminal. In other words, circuit connection relationship does not change, only circuit function converts.

In addition, an embodiment of the present disclosure further provides a display device, comprising the gate driving circuit described above, wherein scanning signals are provided to respective gate lines on an array substrate in the display device via this gate driving circuit.

The shift register and its driving method, the gate driving circuit and the display device provided by the embodiments of the present disclosure have been described above. The shift register provided by the embodiments of the present disclosure comprises an input module, a reset module, a first control module, a second control module, a first output module and a second output module, wherein the input module controls the potential at the first node and the potential at the second node via the input signal terminal, the first reference signal terminal and the first clock signal terminal, the reset module controls the potential at the first node and the potential at the second node via the reset signal terminal, the second reference signal terminal and the second clock signal terminal, the first control module controls the potential at the first node and the potential at the third node via the first DC signal terminal, the second DC signal terminal, the first node and the fourth node, the second control module controls the potential at the fourth node via the first DC signal terminal, the second DC signal terminal, the first node and the second node, the first output module controls the potential at the driving signal output terminal via the third clock signal terminal and the third node, the second output module controls the potential at the driving signal output terminal via the second DC signal terminal and the fourth node. The shift register provided by the embodiment of the present disclosure makes the potential at the third node for controlling the first output module in a stable status via the first control module, and makes the potential at the fourth node for controlling the second output module in a stable status via the second control module, so as to achieve stability of the scanning signal outputted by the driving signal output terminal of the shift register, and further to reduce noise of the scanning signal outputted by the driving signal output terminal, and to improve stability of an output of the shift register.

Obviously, those skilled in the art can make various modifications and variations to the present disclosure without departing from the spirit and scope thereof, and the present disclosure is also intended to include these modifications and variations.

The present application claims priority of the Chinese Patent Application No. 201510624977.5 filed on Sep. 25, 2015, the entire disclosure of which is hereby incorporated in full text by reference as part of the present application.

What is claimed is:

1. A shift register, comprising:
an input module including a first terminal connected to an input signal terminal, a second terminal connected to a first reference signal terminal, a third terminal connected to a first clock signal terminal, a fourth terminal connected to a first node and a fifth terminal connected to a second node, and being configured to supply a signal from the first reference signal terminal to the first node under control of the input signal terminal, and to supply a signal from the first clock signal terminal to the second node under control of the first reference signal terminal;

a reset module including a first terminal connected to a reset signal terminal, a second terminal connected to a second reference signal terminal, a third terminal connected to a second clock signal terminal, a fourth terminal connected to the first node and a fifth terminal connected to the second node, and being configured to supply a signal from the second reference signal terminal to the first node under control of the reset signal terminal, and to supply a signal from the second clock signal terminal to the second node under control of the second reference signal terminal;

a first control module including a first terminal connected to a first DC signal terminal, a second terminal connected to a second DC signal terminal, a third terminal connected to the first node, a fourth terminal connected to a third node and a fifth terminal connected to a fourth node, and being configured to supply a signal from the first DC signal terminal to the third node under control of the first node, to supply a signal from the second DC signal terminal to the third node under control of the fourth node, and to maintain a potential at the first node in a stable status when the first node is in a floating status;

a second control module including a first terminal connected to the first DC signal terminal, a second terminal connected to the second DC signal terminal, a third terminal connected to the first node, a fourth terminal connected to the second node and a fifth terminal connected to the fourth node, and being configured to supply a signal from the first DC signal terminal to the fourth node under control of the second node, to supply a signal from the second DC signal terminal to the fourth node under control of the first node, and to maintain a potential at the fourth node in a stable status when the fourth node is in a floating status;

a first output module including a first terminal connected to a third clock signal terminal, a second terminal connected to the third node and a third terminal connected to a driving signal output terminal of the shift register, and being configured to supply a signal from the third clock signal terminal to the driving signal output terminal under control of the third node; and a second output module including a first terminal connected to the second DC signal terminal, a second terminal connected to the fourth node and a third terminal connected to the driving signal output terminal, and being configured to supply a signal from the second DC signal terminal to the driving signal output terminal under control of the fourth node.

2. The shift register according to claim 1, further comprising:

a noise reduction module including a first terminal connected to the second DC signal terminal, a second terminal connected to the driving signal output terminal and a third terminal connected to the fourth node, and being configured to supply a signal from the second DC signal terminal to the fourth node under control of the driving signal output terminal.

3. The shift register according to claim 1, wherein the input module includes:

a first switching transistor having a gate connected to the input signal terminal, a source connected to the first reference signal terminal and a drain connected to the first node; and a second switching transistor having a gate connected to the first reference signal terminal, a source connected to the first clock signal terminal and a drain connected to the second node.

4. The shift register according to claim 1, wherein the reset module includes:

a third switching transistor having a gate connected to the reset signal terminal, a source connected to the first node and a drain connected to the second reference signal terminal; and a fourth switching transistor having a gate connected to the second reference signal terminal, a source connected to the second node and a drain connected to the second clock signal terminal.

5. The shift register according to claim 1, wherein the first control module includes:

a fifth switching transistor having a gate connected to the first node, a source connected to the first DC signal terminal and a drain connected to the third node;

a sixth switching transistor having a gate connected to the fourth node, a source connected to the third node and a drain connected to the second DC signal terminal; and a first capacitor having one terminal connected to the first node and the other terminal connected to the second DC signal terminal.

6. The shift register according to claim 5, wherein the first control module further includes:

a seventh switching transistor connected between the source of the fifth switching transistor and the first DC signal terminal, having a gate and a source both connected to the first DC signal terminal and a drain connected to the source of the fifth switching transistor.

7. The shift register according to claim 1, wherein the second control module includes:

an eighth switching transistor having a gate connected to the second node, a source connected to the first DC signal terminal and a drain connected to the fourth node;

a ninth switching transistor having a gate connected to the first node, a source connected to the fourth node and a drain connected to the second DC signal terminal; and a second capacitor having one terminal connected to the fourth node and the other terminal connected to the second DC signal terminal.

8. The shift register according to claim 1, wherein the first output module includes:

a tenth switching transistor having a gate connected to the third node, a source connected to the third clock signal terminal and a drain connected to the driving signal output terminal.

9. The shift register according to claim 8, wherein the first output module further includes:

an eleventh switching transistor connected between the gate of the tenth switching transistor and the third node, having a gate connected to the first DC signal terminal, a source connected to the gate of the tenth switching transistor and a drain connected to the third node.

10. The shift register according to claim 1, wherein the second output module includes:

a twelfth switching transistor having a gate connected to the fourth node, a source connected to the driving signal output terminal and a drain connected to the second DC signal terminal.

11. The shift register according to claim 2, wherein the noise reduction module includes:
a thirteenth switching transistor having a gate connected to the driving signal output terminal, a source connected to the fourth node and a drain connected to the second DC signal terminal.

12. The shift register according to claim 1, wherein
in a case where a valid pulse signal of an input signal from the input signal terminal is a high potential, all the switching transistors in one or more of the input module, the reset module, the first control module, the second control module, the first output module and the second output module are N-type switching transistors;
in a case where a valid pulse signal of an input signal from the input signal terminal is a low potential, all the switching transistors in one or more of the input module, the reset module, the first control module, the second control module, the first output module and the second output module are P-type switching transistors.

13. A driving method for a shift register including an input module, a reset module, a first control module, a second control module, a first output module and a second output module, the driving method comprising:
an input stage, wherein the input module supplies a signal from a first reference signal terminal to a first node under control of an input signal terminal and supplies a signal from a first clock signal terminal to a second node under control of the first reference signal terminal, the first control module supplies a signal from a first DC signal terminal to a third node under control of the first node, the second control module supplies a signal from a second DC signal terminal to a fourth node under control of the first node, and a first output signal terminal supplies a signal from a third clock signal terminal to a driving signal output terminal under control of the third node;
an output stage, wherein the input module supplies a signal from the first clock signal terminal to the second node under control of the first reference signal terminal, the first control module maintains a potential at the first node in a stable status, the second control module supplies a signal from the second DC signal terminal to the fourth node under control of the first node, and the first output module supplies a signal from the third clock signal terminal to the driving signal output terminal under control of the third node;
a reset stage, wherein the input module supplies a signal from the first clock signal terminal to the second node under control of the first reference signal terminal, the reset module supplies a second reference signal to the first node under control of a reset signal terminal, the first control module supplies a signal from the second DC signal terminal to the third node under control of the fourth node, the second control module supplies a signal from the first DC signal terminal to the fourth node under control of the second node, and the second output module supplies a signal from the second DC signal terminal to the driving signal output terminal under control of the fourth node; and
a reset maintenance stage, wherein the input module supplies a signal from the first clock signal terminal to the second node under control of the first reference signal terminal, the first control module supplies a signal from the second DC signal terminal to the third node under control of the fourth node, the second control module maintains a potential at the fourth node in a stable status, and the second output module supplies a signal from the second DC signal terminal to the driving signal output terminal under control of the fourth node.

14. The driving method according to claim 13, wherein the shift register includes a noise reduction module, and the driving method further comprises:
in the output stage, the noise reduction module supplies a signal from the second DC signal terminal to the fourth node under control of the driving signal output terminal.

15. A gate driving circuit, comprising a plurality of cascaded shift registers according to claim 1, wherein
an input signal terminal of a first-stage shift register is connected to a frame trigger signal terminal;
an input signal terminal of a shift register in each of the remaining stages except the first-stage shift register is connected respectively to a driving signal output terminal of a previous-stage shift register; and
a reset signal terminal of a shift register in each of the remaining stages except a last-stage shift register is connected respectively to a driving signal output terminal of a next-stage shift register.

16. A display device comprising the gate driving circuit according to claim 15.

17. The gate driving circuit according to claim 15, wherein each of the plurality of cascaded shift registers in the gate driving circuit further comprises:
a noise reduction module including a first terminal connected to the second DC signal terminal, a second terminal connected to the driving signal output terminal and a third terminal connected to the fourth node, and being configured to supply a signal from the second DC signal terminal to the fourth node under control of the driving signal output terminal.

18. The display device according to claim 16, wherein each of the plurality of cascaded shift registers further comprises:
a noise reduction module including a first terminal connected to the second DC signal terminal, a second terminal connected to the driving signal output terminal and a third terminal connected to the fourth node, and being configured to supply a signal from the second DC signal terminal to the fourth node under control of the driving signal output terminal.

19. The shift register according to claim 11, wherein
in a case where a valid pulse signal of an input signal from the input signal terminal is a high potential, the thirteenth switching transistor is an N-type switching transistor;
in a case where a valid pulse signal of an input signal from the input signal terminal is a low potential, the thirteenth switching transistor is a P-type switching transistor.

20. The shift register according to claim 1, wherein the first clock signal, the second clock signal and the third clock signal have the same periodicity and the same duty cycle; and
in a case where a valid pulse signal of an input signal from the input signal terminal is a high potential, a rising edge of the input signal and a rising edge of the second clock signal are aligned, a falling edge of the input signal, a falling edge of the second clock signal and a rising edge of the third clock signal are aligned, a rising edge of the first clock signal and a failing edge of the third clock signal are aligned;

in a case where a valid pulse signal of an input signal from the input signal terminal is a low potential, a falling edge of the input signal and a falling edge of the second clock signal are aligned, a rising edge of the input signal, a rising edge of the second clock signal and a falling edge of the third clock signal are aligned, a falling edge of the first clock signal and a rising edge of the third clock signal are aligned.

* * * * *